United States Patent [19]

Seidler

[11] Patent Number: 4,780,098

[45] Date of Patent: Oct. 25, 1988

[54] CONDUCTIVE LEAD ARRANGEMENT

[75] Inventor: Jack Seidler, Flushing, N.Y.

[73] Assignee: North American Specialties Corporation, Flushing, N.Y.

[21] Appl. No.: 87,084

[22] Filed: Aug. 19, 1987

Related U.S. Application Data

[63] Continuation-in-part of Ser. No. 850,754, Apr. 11, 1986, Pat. No. 4,728,305, and Ser. No. 336,924, Jan. 4, 1982, Pat. No. 4,712,850, said Ser. No. 850,754, is a continuation-in-part of Ser. No. 793,654, Oct. 31, 1985, Pat. No. 4,679,889, which is a continuation-in-part of Ser. No. 737,830, May 24, 1985, Pat. No. 4,605,278.

[51] Int. Cl.⁴ .......................... H01R 4/02; H01R 9/09
[52] U.S. Cl. ...................................... 439/876; 439/65; 439/933
[58] Field of Search .................. 439/61, 65, 69, 74, 439/625, 631, 876, 933, 874, 875

[56] References Cited

U.S. PATENT DOCUMENTS 4,433,892  2/1984  Seidler ................................. 439/876

*Primary Examiner*—Gil Weidenfeld
*Assistant Examiner*—Gary F. Paumen
*Attorney, Agent, or Firm*—Darby & Darby

[57] ABSTRACT

A conductive lead for connection to a first conductive area of a device having two opposed surfaces with a conductive area comprises an elongated conductive body formed from a substantially flat strip of a resilient material. The conductive body has a pair of opposite arms adapted to engage the opposed device surfaces resiliently. A non-conductive element is held by one arm and is adapted to engage the other surface of the device to insulate the lead from the other surface. The conductive area of the other surface is insulated by the lead and the non-conductive element from the conductive area of the first surface.

15 Claims, 6 Drawing Sheets

CONDUCTIVE LEAD ARRANGEMENT

This is a continuation-in-part of pending U.S. patent application Ser. No. 850,754 for Solder-Bearing Lead, filed Apr. 11, 1986, now U.S. Pat. No. 4,728,305, which is a continuation-in-part of application Ser. No. 793,654, filed Oct. 31, 1985, now U.S. Pat. No. 4,679,889, which is a continuation-in-part of Ser. No. 737,830, filed May 24, 1985, now U.S. Pat. No. 4,605,278.

This is also a continuation-in-part of copending U.S. patent application Ser. No. 336,924 for Terminal Strip with Attached Support filed Jan. 4, 1982, now U.S. Pat. No. 4,712,850.

BACKGROUND OF THE INVENTION

With the electronic industry's rapid movement toward surface mount technology, the technical problem of management of high-density integrated circuits, printed circuit boards, and ceramic chip carriers has become increasingly important. In the modern electronic industry, an important necessity is the rapid and accurate assembly of leads, terminals and contacts with the terminals and contact pads of integrated circuits, printed circuit boards, chip carriers or other substrates.

For economy and especially mass production, there is also need in the electronic industry for simple and reliable arrangements enabling a manufacturer to test the circuits of such substrates to determine whether quality is satisfactory before permanently interconnecting them in more complicated circuits. In many instances during testing of substrates having circuits on more than one surface it is important to test the circuit on only one surface and insulate the testing surface from the other.

There is further need in the electronic industry for improved leads, terminals and contacts which can be interconnected in a unitary arrangement for simultaneous handling during assembling operations with printed circuit boards or other substrates.

SUMMARY OF THE INVENTION

It is a principal object of the invention to provide a conductive lead for ready automated attachment to a contact pad or circuit on a printed circuit board or similar substrate, suitable for being continuously stamped from a strip of metal at high speed, with an improved arrangement for electrically isolating the lead from others to permit ready individual testing of circuits connected to such a lead.

Another object of the invention is to provide a conductive lead enabling the user to test individual circuits of printed circuit boards or other substrates as to satisfactory quality before permanently interconnecting them in more complicated circuits.

A further object of the invention is to provide a conductive lead enabling a user to test separately one conductive surface or area of the substrate having a plurality of conductive surfaces or areas.

A still further object of the invention is to provide an improved arrangement of a fixedly interconnected plurality of conductive leads which can be simultaneously assembled to a substrate as a unit.

The invention comprises a conductive lead in the form of an edge clip or terminal adapted to the edging of a substrate carrying conductive surfaces or areas leading to various circuits. The conductive lead has a body portion adapted for receiving and holding both a non-conductive element and a conductive mass, such as a solder slug. In assembly the first and second conductive surfaces of the substrate are positioned between the non-conductive element and conductive mass.

The present invention is an improvement on the arrangement shown in U.S. Pat. No. 4,433,892 issued in the name of the present inventor on Feb. 28, 1984 for Terminal Strip with Auxiliary Support. In that patent, an edge clip arrangement is disclosed in which a series of edge clips for attachment to conductive areas on a circuit-bearing substrate are supported at both ends. At one end, the clips are attached integrally to a carrier strip formed from the conductive blank from which the clips are stamped. Near the other end a finger is formed on the clip, which is crimped around an auxiliary support comprising a continuous plastic strand or filament, to support the clips in uniformly spaced positions to facilitate assembly of the set of clips to the printed circuit board. Another finger opposed to the first finger forms the clip with it, and holds a solder mass for joining the clip electrically to the printed circuit contact pad with which it is engaged. After soldering the series of clips to their respective contact pads, the carrier strip is cut away. This arrangement is not disclosed as permitting testing of inidividual circuits before soldering. Also, both fingers of the clip are in electrical contact with the respective surfaces of the printed circuit board.

Another arrangement for a solderable lead which permnits testing before soldering is shown for Solder Bearing Clip in U.S. Pat. No. 4,597,628 issued in the name of the present inventor on July 1, 1986. This patent discloses a bandolier arrangement of non-conductive material for supporting edge clips of construction radically different from the present clips, for the purpose of permitting testing before soldering.

The present invention provides a greatly simplified arrangement for accomplishing this result, by automatic high speed multi-stage progressive stamping equipment, while at the same time providing further advantages in avoiding possible short circuits between opposed faces of a conductor-carrying substrate.

BRIEF DESCRIPTION OF THE DRAWINGS

Other objects and advantages of the invention will become apparent upon reading the following detailed description and upon reference to the drawings, in which:

FIG. 1 is a side elevational view of a conductive lead according to the invention assembled with a printed circuit board or the like;

FIG. 10 is a side elevation view of another form of the invention for edge-to-edge coupling of printed circuit boards or the like.

DESCRIPTION OF THE PREFERRED EMBODIMENT

Figure 1:
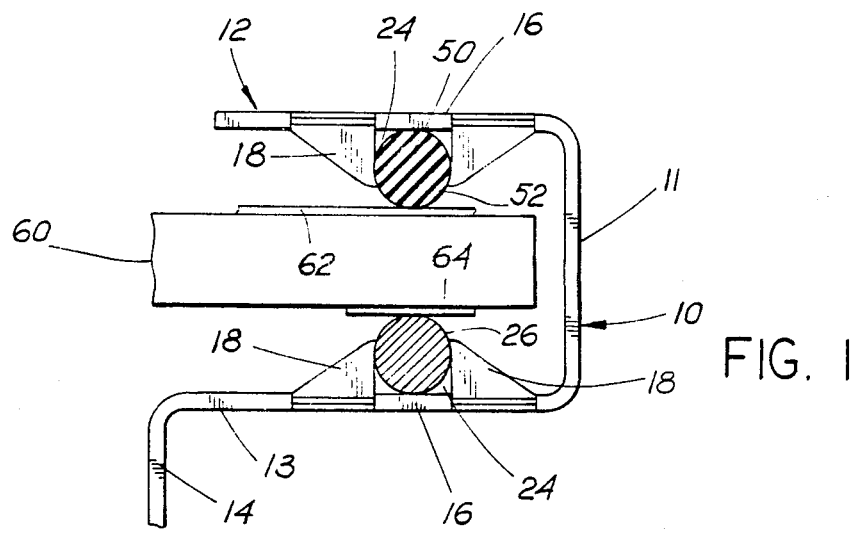
Figure 2:
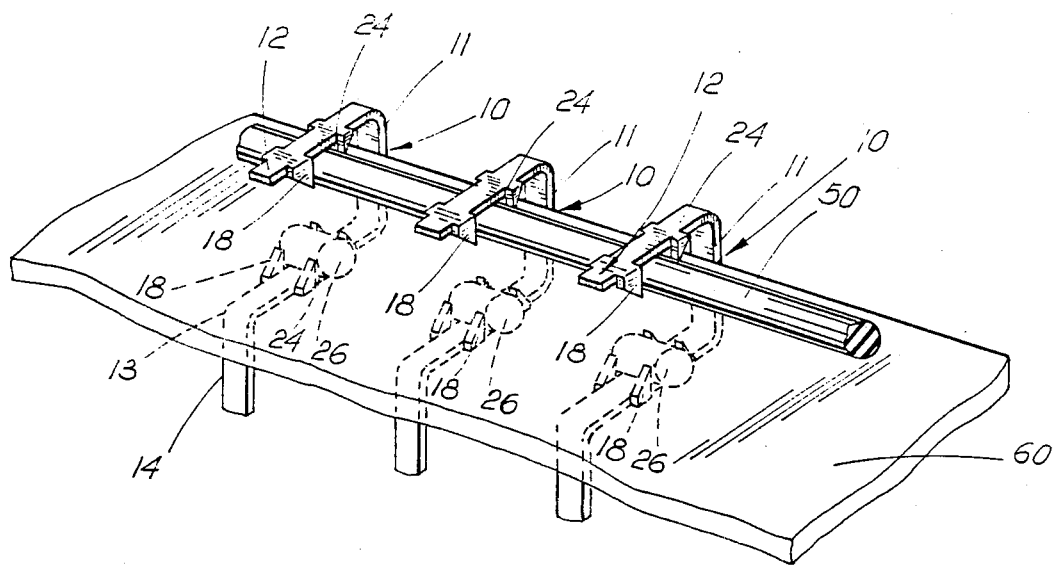
FIG. 2 is an isometric view of a series of leads shown in FIG. 1 assembled on a substrate.

FIGS. 1 and 2 show a simple verison of the invention in the form of an edge clip 10 for a substrate 60 (such as a printed circuit board, integrated circuit, chip carrier or the like). In conventional practice, such substrates carry closely spaced electrical circuits in the form of conductive strips which terminate adjacent the edge of the substrate in conductive areas known as contact pads. Such contact pads are also closely spaced along the edge of the substrate on centers which may be as small as 0.100 or 0.050 inch apart. Such circuits and pads may be on the top and bottom surfaces of the substrate 60, although not necessarily opposite one another. Conventional solder-bearing edge clips such as model number NAS 049 of the inventor's assignee, North American Specialties Corporation, serve to connect electrically to one or both of the upper and lower contact pads to which the clip may be soldered. However, where it is desired to connect only to one but not both of the upper and lower pads or conductive areas such conventional edge clips may inadvertently cause an undesired connection between upper and lower conductive areas if the clip or pad is misaligned or mispositioned even slightly.

It is conventional practice to engage a set of such edge clips simultaneously with a number of contact pads. To do so, the clips must be retained with a fixed uniform spacing matching the spacing of the contact pads. Conventionally this is done by keeping the clips joined integrally to a carrier strip forming part of the strip material from which the clips are formed by progressive multi-stage stamping. However, in this arrangement all the clips are electrically interconnected by the carrier strip until after the clips are soldered to their respective contact pads, at which time the carrier strip is removed. This presents the disadvantage that individual circuits on the substrate cannot be separately tested until the carrier strip is removed after the clips are soldered into place.

The present invention provides a solution to these problems and overcomes these disadvantages by interposing a non-conductive element between one arm of the clip and the substrate to assure that there is no electrical connection between that arm and the conductive areas on the corresponding substrate surface. Such a non-conductor is made continuous to extend over at least a set of clips so as to hold them in proper relation to one another permitting removal of the conventional carrier strip at earlier stages of fabrication i.e., after the clips are assembled on the substrate, but before soldering them to the contact pads. The clips are thus insulated from one another to allow individual circuit tests before soldering. Hence, where a defective circuit is located, the soldering step is saved and remedial action may be taken which would not be practicable if the clips were soldered in place.

This result is attained by a construction which is simple to fabricate automatically on high speed multistage progressive stamping equipment. This construction is shown in FIGS. 1 to 5.

As shown in FIG. 1, the conductive lead 10 is formed of an elongated body section 16 of resilient conductive material of length appropriate for the intended use of the finished lead, and having oppositely extending tabs 18 on its lateral edges, in the form of sloping extensions with a gap 20 between them. The gap 20 is dimensioned to have a width substantially equal to the width of an insulator element 50 (in the form of filament, strand, or rod) or the width of a solder wire or mass 26 to be laid in the gap. The depth dimension of each tab 18 is somewhat less than the width of the insulator 50 and the solder wire 26, as will be seen. It will be understood that the tabs 18 are not necessarily triangular in shape but may be rectangular or of other shape, preferably with straight or arc-shaped edges extending transversely from the lead body. The holding arrangements for the non-conductive element 50 and the solder mass 26 are similar to the holding arrangement for a solder mass described in parent application Ser. No. 793,654.

Figure 3:
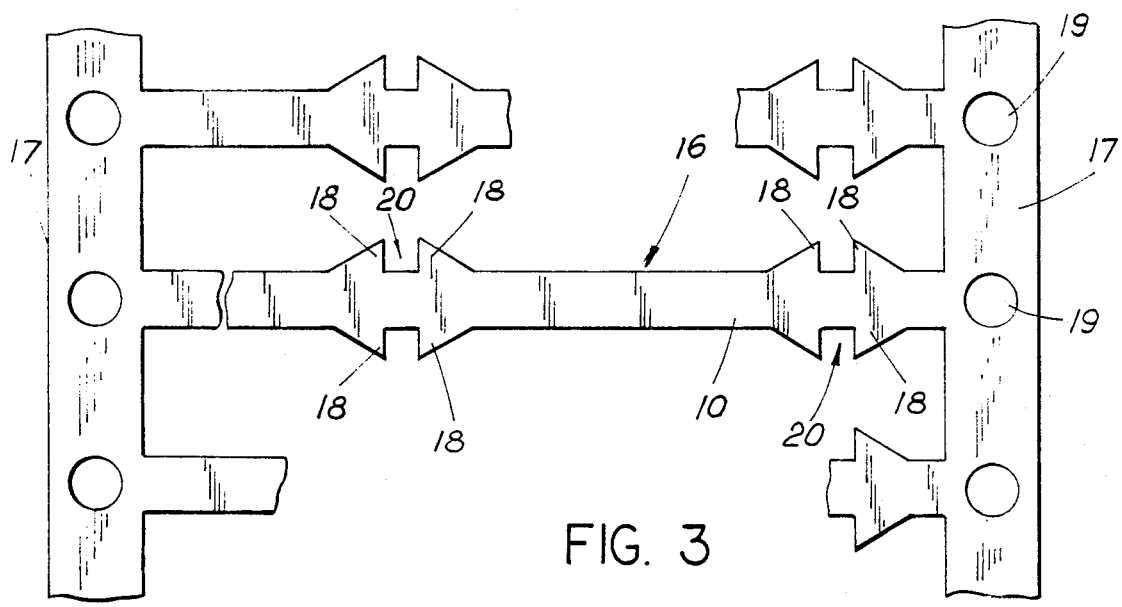
FIG. 3 shows a plan view of a conductive strip formed into flat blanks for use in making one embodiment of the improved conductive lead of the invention.

Each lead of the blank shown in FIG. 3, may be formed by progressive multiple stage stamping from a strip of appropriate material with the lead bodies 16 extending from a carrier strip 17 on one or both ends of the bodies 16, having indexing holes 19 for step-wise advancement of the work during progressive stamping.

Figures 4A, 4B:
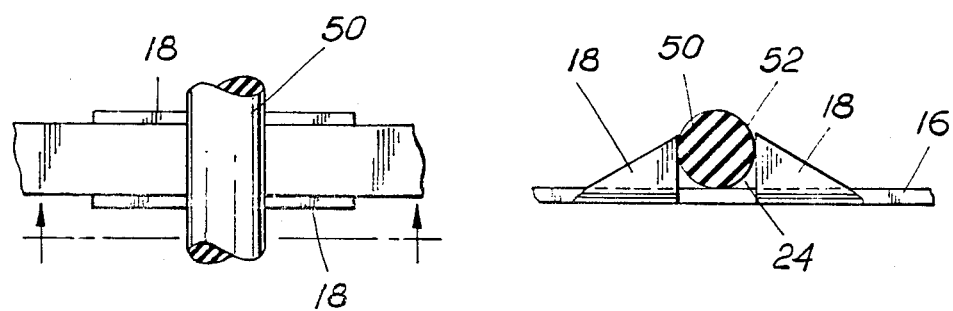
FIG. 4A is a plan view of a portion of one of the leads made from the blank of FIG. 3, formed to hold a non-conductive element.
FIG. 4B is a side elevation view of the arrangement of FIG. 4A, showing a non-conductive element between retaining tabs.
Figure 7:
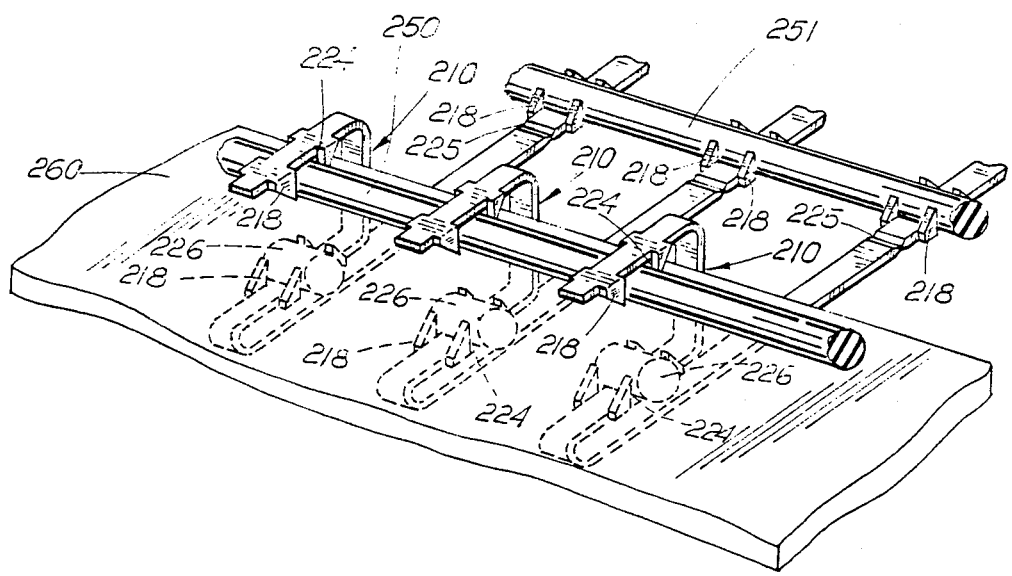
FIG. 7 is an isometric view of a series of leads shown in FIG. 5, assembled on a substrate.

In the forming process, the tabs 18 are bent out of the plane of the body section 16 into a substantially perpendicular position, as shown in FIGS. 4A and 4B, thereby providing channels 24 each channel having a "floor" formed by the body section 16, and sides formed by the inwardly facing edges of the tabs 18. Into one channel is laid an insulator, preferably as a continuous non-conductive flexible rod or filament 50. The non-conductive element 50 preferably closely conforms to the width of the channel 24 and extends somewhat above the channel 24, as seen in FIG. 4B, so that the insulator has a protruding surface 52.

After the non-conductor 50 is positioned within channel 24, the tabs 18 may be bent inwardly over the non-conductor 50 to stake it in place and thereby retain it physically connected to the body section 16. The insulator 50 may optionally be cut later on either side of the body 16 at an appropriate distance from the tabs 18 to supply the desired length of rod. A solder mass 20 is joined to each lead by being laid into a similar channel 24, with tabs 18 staked around it, as described in parent application Ser. No. 793,654.

Such leads may be individually engaged with respect to individual contact pads of a printed circuit board or like substrate, upon severing from the carrier strip or strips 17. Alternatively, a series of such leads joined by one or more carrier strips 17 may be engaged simultaneously with a correspondingly spaced series of conductive areas on the substrate, after which the carrier strips 17 are severed.

The insulator 50 need not be cut at each lead, but instead a series of leads of appropriate number are kept joined and physically interconnected by means of the non-conductor 50 extending between them. This permits severing the leads from the carrier strip or strips 17 while still handling a series of leads fixedly spaced as a comb-like unit thereby allowing engagement of the solder masses of the whole series of clips with a similarly spaced series of conductive areas on one side of the substrate.

The lead of the present invention is illustrated in one embodiment as the clip 10 of FIG. 1. It has a generally U-shape with an upper arm 12 and a lower arm 13 joined by a base 11. The material of clip 10 is resilient so that arms 12 and 13 are urged toward one another and are resiliently clipped in and retained against substrate 60. A terminal 14 is an integral part of one arm, shown as lower arm 13 in this instance. As described above, lower arm 13 is configured to retainer a solder mass 26 between a pair of tabs 18 bent upwardly from one or both edges of the main body of clip 10. These tabs may be duplicated on the opposite edge of the body of clip 10. The upper arm 12 has a configuration similar to the lower arm 12, but holds the non-conductor element 50 instead of the solder mass 26 between corresponding tabs 18. It will be understood that the location of the solder mass 26 and the non-conductor 50 need not be restricted to that shown in FIG. 1. For example, the upper arm 12 may hold the solder mass 26 and the lower arm may accommodate the non-conductor 50. The non-conductor 50 preferably extends continuously over an array or set of equally spaced clips matching the spacing of contact pads as illustratively shown in FIG. 2.

FIGS. 1 and 2 show the conductive lead 10 assembled with a printed circuit board 60 or a similar arrangement having two contact pads 62 and 64 on its opposite surfaces. The insulator 50 and the solder 26 are located within the channels 24 defined by the bent tabs 18. The insulator 50 is dimensioned to be fixedly positioned within the channel 24 and to have an exposed surface 52 which extends beyond the tabs 18 in the direction opposite to the channel floor 16. The exposed surface 52 is placed in direct contact with the conductive surface 62 so as to space the tabs 18 from the conductive surface 62. This arrangement substantially eliminates electrical contact between the conductive surface 62 and the conductive lead 10.

The solder mass 26 has a dimension extending away from the floor 16 of its channel at least as great as the extent of the tabs 18. FIG. 1 shows the solder mass 26 extending beyond the tabs 18 in the direction opposite to its channel floor 16, spacing the tabs from the conductive surface 64. However, the solder mass can be made flush with the outside edges of the tabs 18.

Thus, each clip 10 may have a substrate 60 interposed between its arms 12, 13 so that the solder 26 on lower arm 12 is in contact with a desired conductive area 64 while on the opposite side of the substrate the upper arm 13 is maintained insulated from any conductive area such as 62 on the upper face of the substrate.

In this way, upon positioning the clip 10 (individually or in an array) on the substrate 60, contact is made between the lead 10 and the conductive area or areas 64. The resilience of the clip material holds it in position on the substrate permitting testing of the circuitry on the substrate without requiring that the clip be soldered to the substrate. At the same time, inter-connection between the lower and upper contact pads is prevented. If the test is satisfactory, by application of heat the clip or clips may be soldered to the area or areas 64. However, if the test is unsatisfactory the solder step may be avoided and remedial action take, thereby providing economy in production.

Figure 5:
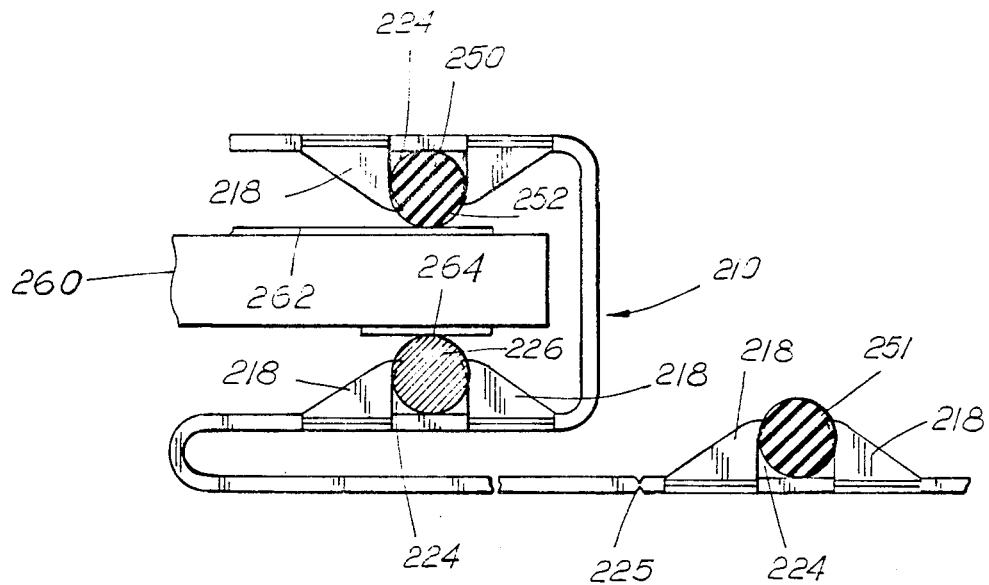
FIG. 5 shows a side elevation view of a modified conductive lead for a printed circuit board, according to the present invention.
Figure 6:
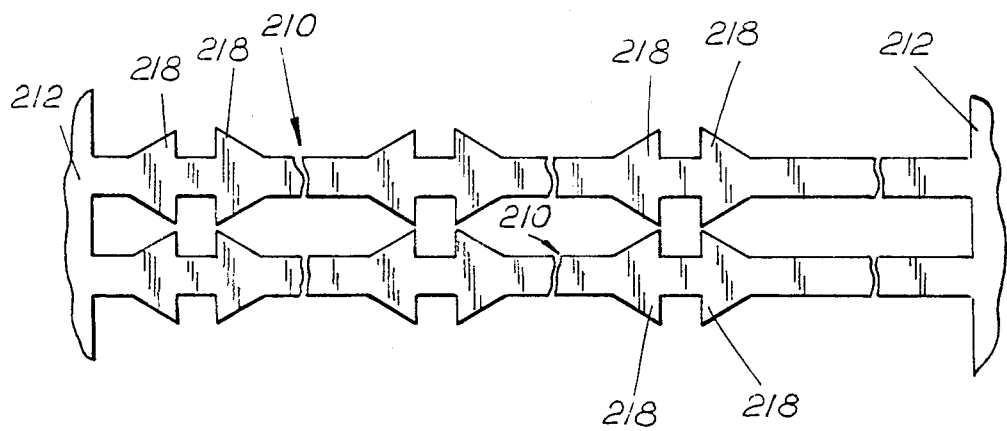
FIG. 6 shows a plan view of a modified form of stamped blank for the embodiment of FIG. 5.

FIG. 5 shows another form of a conductive lead according to the present invention, formed from the blank shown in FIG. 6. In this instance, the body of the lead 210 extending between the carrier strips 212 has three sets of tabs 218, so that the three receiving channels 224 are defined on the lead 210. Two channels accommodate the non-conductive elements 250 and 251 and the third channel accommodates the solder mass 226. The substrate 260 having the contact pads 262 and 264 is inserted between the solder 226 and the non-conductive element 250.

The solder mass 226 engages the contact pad 264 providing an electrical contact between the conductive lead 210 and the substrate 260. The exposed surface 252 of the nonconductor 250 spaces its tabs 218 from the contact pad 262, insulating the pad 262 from the conductive lead 210 and substantially preventing undesirable connection between the contact pads 262 and 264.

The second non-conductive element 251 serves to hold the leads together, properly spaced, after the carrier strips (e.g. 212) are cut away, while still permitting testing of individual leads. Break-away notches 225 may be provided, permitting the outer non-conductor 251 to be broken off after the leads are soldered in place.

Figure 8:
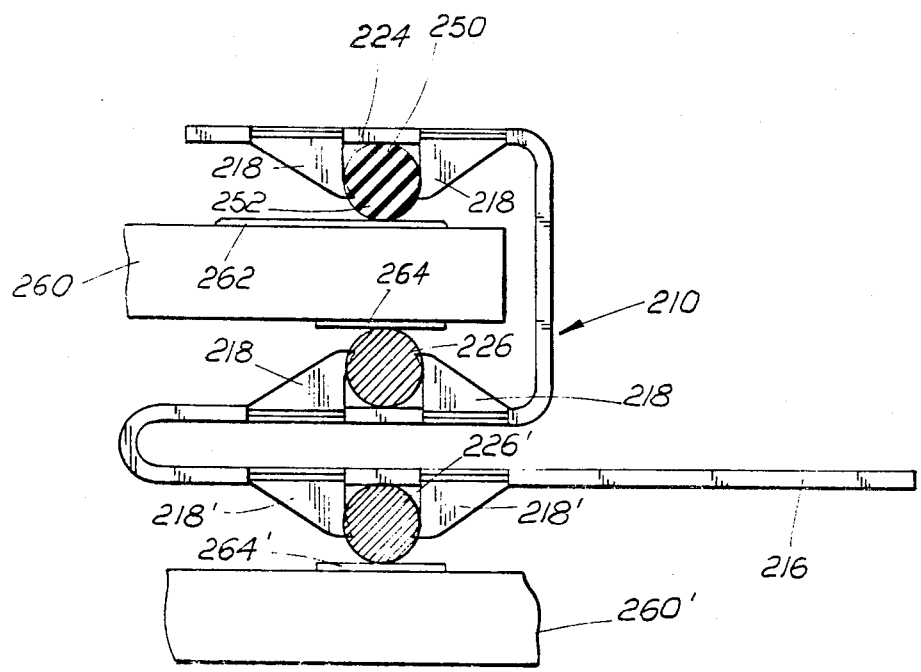
FIG. 8 shows a side elevational view of another form of conductive lead for a printed circuit board according to the invention which may be formed from the blank of FIG. 6.
Figure 9:
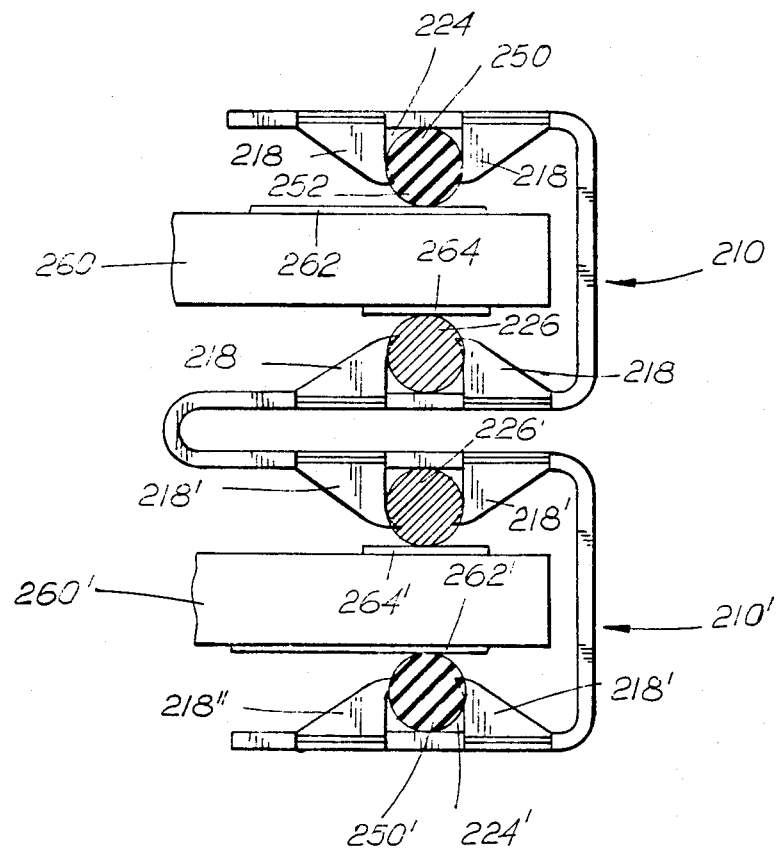
FIG. 9 shows a side elevational view of a further form of conductive lead for a printed circuit board, according to the invention.

The blank illustrated in FIG. 6 may also be bent in the form shown in FIG. 8. The insulation element 251 is replaced at each lead by a solder mass 226', held in position by tabs $218^1$. This permits the lead 210 to be surface mounted and soldered to a second substrate $260^1$, at its contact pad 264'. If desired, the lead 210 may be extended as at 216 for connection to other electrical elements. By way of example, as shown in FIG. 9 a further set of tabs 218" may be provided, to hold a second non-conductive 250'. In this embodiment the non-conductive elements 250 and $250^1$ insulate the conductive surface 262 of the substrate 260 and the conductive surface $262^1$ of the substrate $260^1$ from the conductive lead 210, while still providing clip retention by the two substrtes. The arrangement of FIG. 9 enables the testing of the circuits of contact pads 264 and $264^1$ of the substrate 260, while excluding the pads 262 and $262^1$ from testing.

Figure 10:
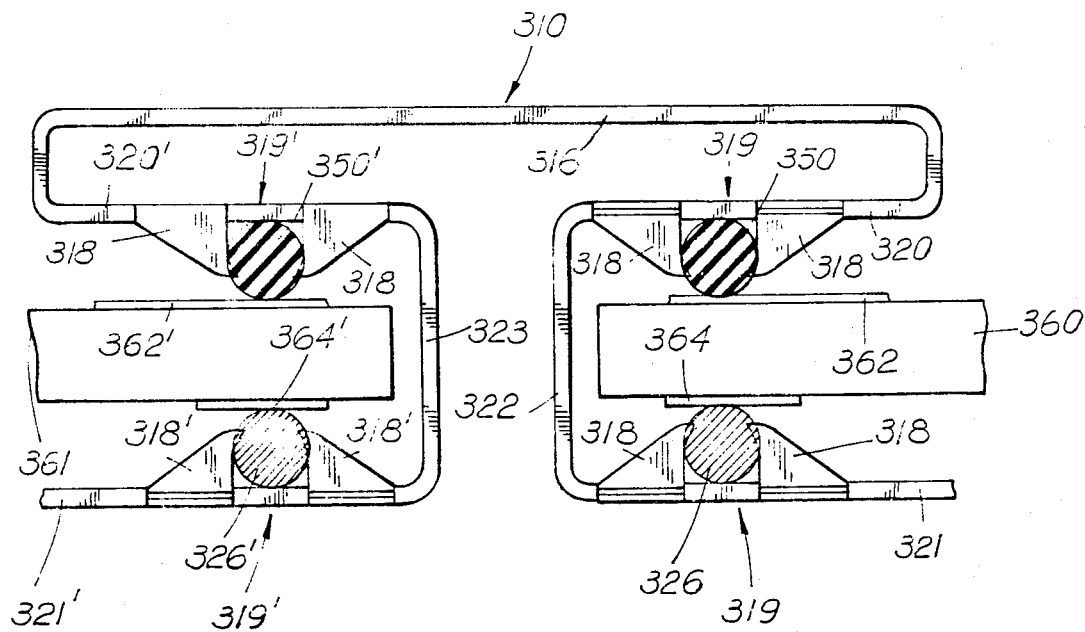

FIG. 10 shows an embodiment of the invention adapted for receiving and/or joining two printed circuit boards of substrates 360 and 361 in edge-wise or coplanner alignment. The body of the conductive lead 310 defines two C-shaped portions each having two main arms 320, 321 and $320^1$, and $321^1$ and connecting sections 322, 323 interconnecting the pairs of main arms. At least four retention arrangements 319, $319^1$ are on the main arm 320, 321 and $320^1$, $321^1$. Each retention arrangement is defined by a pair of spaced laterally extending tabs 318, $318^1$ having an opening between them similar to tabs 18 of FIG. 4, and forming similar channels. The retention arrangements 319, $319^1$ fixedly receive non-conductors 350 and $350^1$ and solder masses 326 and $326^1$.

When the substrates 360, 361 are inserted within the C-shaped clip portions of the conductive lead 310, the non-conductors 350, 350', act similarly to non-conductors 250, 250' at the embodiment of FIG. 3 to join the series of leads 310 in fixed spacings, and to insulate the leads 310 from any conductive areas such as 362, 362', on one surface of each of the substrates. The solder masses 326 and $326^1$ may extend beyond the tabs 318, $318^1$ or may be flush with the outside edges of these tabs and upon heating will solder each lead to a respective contact pad. The arrangement of FIG. 10 affords the ability to test simultaneously through the conductive lead 310 the inter connected contact pads or the two substrates 360 and 361, so as to be able to reject and replace unsatisfactory substrates prior to soldering the conductive leads 310 to them.

It will be understood that a variety of lead configurations may incorporate the present invention. For example, the non-conductor and solder may be interchanged so that the non-conductor is on the lower arm of each clip while the solder is on the upper arm.

It will be understood that the terminal portion (the portion 14 of FIG. 1, for example) of any of the leads of the present invention may take any desired configuration. It may be formed as a pin to be received in a connector or in an opening of a further printed circuit board or the like, so as for example to be soldered thereto. It may be formed as a solderable lead for surface mounting on another substrate, as shown in FIG. 8.

Although the present invention has been described with reference to particular embodiments and examples, it will be apparent to those skilled in the art that variations and modifications can be substituted for them without departing from the principles and true spirit of the invention, which is defined by the accompanying claims.

What is claimed as the invention is:

1. A conductive lead for connection to one conductive area of a device have first and second opposed surfaces, each with a conductive area, said lead comprising:
    an elongated conductive body formed from a substantially flat strip of resilient material and having a pair of opposed arms adapted to engage said opposed device surfaces resiliently,
    one of said arms carrying a conductive solder element adapted to contact a said conductive area on the first of said surfaces,
    a non-conductive element held by the other of said arms and adapted to engage the second of said surfaces to insulate said lead from said second surface,
    whereby the conductive area of said second surface is insulated by said lead and said non-conductive element from the conductive area of said first surface.

2. A conductive lead according to claim 1 wherein said body comprises a tab integral with said body and extending generally perpendicular to said body strip, said tab engaging and assisting in retaining said non-conductive element in a position to be fixedly opposed to said second surface of said device.

3. A substantially parallel array of conductive leads according to claim 1, the non-conductive elements of said leads being portions of a single continuous elongated non-conductor strip which is adapted to support and fix the positions of said leads with respect to one another.

4. A conductive lead according to claim 1 wherein said body is an elongated strip-like element, having a first pair of spaced tabs at the lateral edges of the body and defining an opening therebetween.
    said body also having a second pair of spaced tabs at the lateral edges of said body and defining a second opening therebetween,
    said pairs of tabs being bent substantially perpendicular from the body to form therebetween at least a part of first and second channels with said body forming a floor for said first and second channels,
    a solder mass in said first channel and bordered by one of said pair of tabs,
    said non-conductor being located in said second channel and bordered by the other of said pairs of tabs,
    said tabs being bent inwardly of said channels to retain said solder mass and said non-conductor element therein.

5. A conductive lead according to claim 4 wherein said non-conductive element has an exposed surface, extending beyond the pair of tabs defining said second channel in the direction opposite to said channel floor, and said solder mass has a dimension extending away from said floor at least as great as the extent of said tabs,
    whereby said exposed surface of the non-conductive element may be placed in direct contact with one surface of said device substantially spacing said tabs from said surface and electrically insulating said surface from said conducting lead.

6. A conductive lead as in claim 5, wherein said solder dimension is substantially equal to the projection of said tabs away from said body portion.

7. A conductive lead according to claim 4 further including an additional non-conductive element held on said body spaced from said two arms.

8. A conductive lead according to claim 7 wherein said additional non-conductive element is held by a third pair of spaced laterally extending tabs defining an opening therebetweeen and positioned on the body portion,
    said third pair of tabs being bent substantially perpendicular from the body portion to form therebetween part of a third channel and said body portion forming a floor for said third channel.

9. An array of conductive leads according to claim 3 wherein the body of each said conductive lead is defined by an elongated strip-like element, said body comprising a pair of spaced tab laterally extending from the body and defining an opening therebetween,
    said pair of tabs being bent substantially perpendicular from the body to form therbetween part of a channel with said body forming a floor for said channel,
    said continuous non-conductor being in said channel and bordered by said pair of tabs,
    said tabs being bent inwardly of said channel to retain said non-conductor therein.

10. An array of conductive leads according to claim 9 wherein said non-conductor extends beyond said pair of tabs of each lead in the direction away from said floor,
    whereby said extending portion of said non-conductor element may be placed in direct contact with said second surface of said device spacing said tabs from said second surface and electrically insulating said second surface from said conductive lead.

11. An array of conductive leads according to claim 10 wherein said solder extends from said body by a dimension substantially equal to the projection of said tabs away from said body.

12. An array of conductive leads according to claim 3 comprising a second continuous non-conductor held on said body portion at a position spaced from said arms and additionally fixedly positioning said leads relative to one another.

13. A array of conductive leads according to claim 12 wherein said second non-conductor is held on each lead by a pair of spaced laterally extending tabs defining an opening therebetween, said pair of tabs being bent substantially perpendicular from the body to form therebetween part of a channel and said body forming a floor for said channel, said channel retaining said second non-conductor.

14. A conductive lead engaging a plurality of devices, each having a plurality of surfaces, at least one said surface of each said device comprising a conductive area, comprising an elongated body portion, said body portion having at least four retainers holding non-conductive elements and conductive solder masses, said conductive lead defining at least two generally U-shaped portions, each said U-shaped portion having two main arms and a connecting section interconnecting said arms, each said U-shaped portion having one of said retainers on each arm in such a manner that a respective one of said non-conductive elements faces a portion of a respective one of said solder masses.

15. An arrangement according to claim 14 wherein the body portion is an elongated strip-like element, each of said retainers is defined by a pair of spaced laterally extending tabs defining an opening therebetween, said tabs being bent substantially perpendicularly from the body to form therebetween a channel and said body portion forming a floor of said channel, each said channel retaining one of said non-conductive elements or one of said solder masses.

* * * * *